United States Patent
Masuda et al.

(10) Patent No.: US 7,271,471 B2
(45) Date of Patent: Sep. 18, 2007

(54) METAL SUBSTRATE APPARATUS, METHOD OF MANUFACTURING AN IC CARD MODULE APPARATUS, AND AN IC CARD MODULE APPARATUS

(75) Inventors: Masachika Masuda, Shinjuku-Ku (JP); Chikao Ikenaga, Shinjuku-Ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 11/086,238

(22) Filed: Mar. 23, 2005

(65) Prior Publication Data

US 2005/0275071 A1 Dec. 15, 2005

Related U.S. Application Data

(63) Continuation of application No. PCT/JP2004/008534, filed on Jun. 17, 2004.

(30) Foreign Application Priority Data

Jun. 17, 2003 (JP) ............................. 2003-172221
Dec. 20, 2004 (JP) ............................. 2004-368041

(51) Int. Cl.
    H01L 23/495 (2006.01)
    H01L 21/00 (2006.01)
    H05K 7/18 (2006.01)

(52) U.S. Cl. .................. 257/676; 257/692; 257/773; 257/E23.043; 361/813; 438/121

(58) Field of Classification Search .................. None
See application file for complete search history.

(56) References Cited

U.S. PATENT DOCUMENTS

2004/0018663 A1* 1/2004 Michii et al. ............... 438/112

FOREIGN PATENT DOCUMENTS

| JP | 1-302757 | 12/1989 |
| JP | 7-058273 | 3/1995 |
| JP | 2000-174176 | 6/2000 |

* cited by examiner

*Primary Examiner*—Alonzo Chambliss
(74) *Attorney, Agent, or Firm*—Oliff & Berridge, PLC

(57) ABSTRACT

A metal substrate apparatus comprises a plurality of metal substrates forming an IC card module used in manufacturing transfer mold-type non-contact IC cards. The metal substrate apparatus comprises a thin metal strip of processing material, and each metal substrate has connecting parts. Each metal substrate has a die pad for loading an IC chip. Antenna terminals to connect antenna coils are located outside the die pad and a resin-sealed region. The antenna terminals of one metal substrate and those of a longitudinally adjacent metal substrate overlap a shared region of the processing material in a width direction. The metal substrates can be separated by sealing and then making longitudinal cuts on the processing material on the outer parts of the metal substrates along two connecting lines.

12 Claims, 9 Drawing Sheets

METAL SUBSTRATE APPARATUS, METHOD OF MANUFACTURING AN IC CARD MODULE APPARATUS, AND AN IC CARD MODULE APPARATUS

BACKGROUND OF THE INVENTION

1. Field of the Invention

This invention relates to a metal substrate apparatus for a transfer mold-type IC card module used in manufacturing non-contact IC cards, a manufacturing method for a transfer mold-type IC card module apparatus used in manufacturing non-contact IC cards with the said metal substrate, and an IC card module apparatus.

2. Background Art

IC card technology continues to spread gradually due to the need for protecting the privacy of information. In recent years, there have been proposed non-contact IC cards which can send and receive information without contact with a device for reading and writing information (reader-writer). Among the proposed IC cards, those which use electromagnetic waves to exchange signals with an outside reader-writer, or exchange signals and supply power, have been practically developed.

FIGS. 8(a), 8(b) show an example of one of these non-contact IC cards. FIG. 8(a) shows an IC module 812 connected to an antenna 811. FIG. 8(b) illustrates the typical circuit structure of such a card.

In FIGS. 8(a) and 8(b), the IC card 810 has the antenna 811, the IC module 812, and a terminal 813 (of the IC module).

With regard to the loading on an IC chip on this type of IC module, the most commonly used mounting method is COB (Chip on Board), where the IC chip is loaded onto a print board and connected to the print board by a bonding wire. The drawback to this method is that the mounting thickness cannot be reduced. Recently, a separate mounting method has been proposed in which the mounting thickness can be reduced and mass production is possible. In this method, an IC chip is mounted on a die pad of a half-etched metal substrate, and connected to terminals of the metal substrate by a bonding wire.

In an IC module formed in this manner, a single metal substrate has various regions after its processing material is processed, including a region where the IC chip is loaded (die pad), a region for connection with the antenna circuits, and a region for input and output terminals. The metal substrate is separated and formed when parts of these regions are connected. When forming the IC module, these regions are connected to the processing material via connecting parts, so that a plurality of individual metal substrates are attached to the processing material. After IC chips are loaded onto the individual metal substrates, the metal substrates are sealed with sealing resin and cut and separated at prescribed connecting parts.

In some cases, an individual metal substrate is called a lead or a lead frame. The device is called a lead frame when a plurality of individual metal substrates are attached directly to the processing material or to a frame and connecting parts connected.

When such a metal substrate is formed by pressing, burrs 911 may be formed during pressing. As shown in FIG. 9(a), if the metal substrate has been resin-sealed, resin leakage 931 can occur through the rear side. The etching method is adopted to avoid these problems. FIG. 9(b) shows that through the etching method, no resin leakage occurs in the sealing process.

In FIGS. 9(a) and 9(b), there are shown a metal substrate 910, IC chip 920, sealing resin 930, resin leakage 931, and bonding wire 940.

With regard to the etching method, a thin Cu material or 42 alloy (42% Ni—Fe alloy) may be used for the processing material. In addition, the conventional reel-to-reel method (reel method) may be used for the plate processing and etching.

Following the etching of the processing material and the attachment of the metal substrate on the surface of the processing material, the processing material then undergoes plating, with either some parts plated in silver and other in palladium or the entire material plated in palladium, followed by mounting of the IC chips, wire bonding, and resin sealing for each metal substrate. These processes are carried out consecutively or divided into different stages and carried out by the reel method.

Conventionally, in the etching of the processing material, when manufacturing the metal substrates for the IC module by the reel method after attaching them to the processing material, the metal substrates are arranged and manufactured one-by-one such that they do not overlap, as shown in FIG. 7(a).

FIG. 7(b) shows the metal substrate of FIG. 7(a) after being loaded with an IC chip in a die pad 621 and sealed with sealing resin by the transfer method.

Thereafter, an IC card module is obtained by cutting at prescribed lines.

In FIGS. 7(a) and 7(b), the parts represented are the processing material 611, individual metal substrate 620, die pad 621, half-etching part 621H, terminals 622A and 622B (to connect to the antennas), through-hole 625, connecting part 626, sprocket 628, and sealing resin 640.

The foregoing conventional metal substrate manufacturing method is described in JP Laid-Open Publication 2000-174176.

As described above, there is known a metal substrate for use in an IC module, wherein an etching process is carried out on a processing material, and a metal substrate for an IC module is attached to the surface of the processing material, the metal substrate being further processed by the reel method. In this case, an IC module for non-contact-type IC cards must be mass-producible at a low cost.

SUMMARY OF THE INVENTION

The present invention has been made with the foregoing problems in mind, and it is an object of the present invention to provide an IC module for a non-contact-type IC card, a metal substrate apparatus well-suited for mass-production and a method of manufacturing and IC card module apparatus.

A metal substrate apparatus for a non-contact IC card module according to the present invention comprises:

a plurality of metal substrates;

the plurality of metal substrates arranged longitudinally in a row and formed by etching a strip of a processing material extending in a longitudinal direction, wherein each metal substrate has a die pad for loading an IC chip, a resin-sealed region including the die pad, at least one pair of antenna terminals protruding longitudinally in opposite directions from the die pad and the resin-sealed region, and one of the antenna terminals of one metal substrate and one of the antenna terminals of the longitudinally adjacent metal substrate are located within the same region of the processing material in a width direction.

In the metal substrate apparatus,
each metal substrate is connected to the processing material by connecting parts positioned on connecting lines running in a longitudinal direction, and
the metal substrates can be separated from the processing material by cutting along the connecting lines.

In the metal substrate apparatus,
each metal substrate has two pairs of antenna terminals,
each antenna terminal protruding longitudinally in opposite directions from the die pad and the resin-sealed area.

In the metal substrate apparatus,
the die pad of each metal substrate is formed larger than the IC chip, and an IC chip loading region of the die pad is formed thinner than the processing material by half-etching.

In the metal substrate apparatus,
each metal substrate includes a concave part or through-hole which is arranged in the resin-sealed region to improve the adhesion with a sealing resin to be provided on the resin-sealed region.

In the metal substrate apparatus,
each metal substrate includes an internal terminal disposed between the die pad and the antenna terminal.

In the metal substrate apparatus,
the processing material is made of either Cu or 42 alloy.

The present invention provides a method for manufacturing an IC card module, comprising the steps of: preparing a metal substrate apparatus for a non-contact IC card module comprising a plurality of metal substrates, the plurality of metal substrates arranged longitudinally in a row and formed by etching a strip of a processing material extending in a longitudinal direction, each metal substrate having a die pad for loading an IC chip, a resin-sealed region including the die pad, at least one pair of antenna terminals protruding longitudinally in opposite directions from the die pad and the resin-sealed region, one of the antenna terminals of one metal substrate and one of the antenna terminals of the longitudinally adjacent metal substrate being located within the same region of the processing material in a width direction,
loading an IC chip on the die pad of each metal substrate;
connecting the IC chip to a prescribed portion of the metal substrate with a wire through wire bonding;
sealing the resin-sealed region of the metal substrate by covering the IC chip and wire with a sealing resin; and
cutting the processing material for each IC chip.

In the method for manufacturing an IC card module,
the processing material is made of Cu or 42 alloy.

The present invention provides an IC card module apparatus comprising:
a metal substrate apparatus including a plurality of metal substrates arranged longitudinally in a row and formed by etching a strip of a processing material extending in a longitudinal direction, each metal substrate having a die pad for loading an IC chip, a resin-sealed region including the die pad, at least one pair of antenna terminals protruding longitudinally in opposite directions from the die pad and the resin-sealed region, one of the antenna terminals of one metal substrate and one of the antenna terminals of the longitudinally adjacent metal substrate being located within the same region of the processing material in a width direction;
an IC chip loaded in the die pad of each metal substrate;
a wire connecting the IC chip to a predetermined position of each of the metal substrates by wire bonding;
a sealing resin provided in the resin-sealed region of each metal substrate to cover and seal the IC chip and wire;
a mold gate disposed on the processing material, connected to the sealing resin and extending in a width direction.

In the IC card module apparatus,
the metal substrates are arranged in multiple rows in a width direction on the processing material, and a mold through gate connecting the sealing resins of the metal substrates extends in the width direction.

In the IC card module,
openings are disposed near the pair of antenna terminals of each metal substrate of the processing material to insulate the antenna terminals from other parts of the processing material.

The metal substrate apparatus for an IC card module according to the present invention is suitable for manufacturing IC modules for non-contact IC cards and well-suited for mass-production.

In more detail, each metal substrate has a die pad for loading an IC chip and antenna terminals located outside the die pad and resin-sealed region for connecting with the antenna coil, either two antenna terminals for connecting with one loop of antenna coil or four terminals for connecting with two loops of antenna coil. The individual metal substrates are arranged longitudinally on the processing material so that the antenna terminal region of one metal substrate overlaps with the antenna region of a longitudinally adjacent metal substrate in a shared region of the strip of processing material. After the metal substrates are resin-sealed, the metal substrates can be separated from other parts simply by introducing longitudinal cut lines at a prescribed width in two places outside the resin-sealed region.

The metal substrate apparatus for an IC card module according to the present invention can be manufactured using the reel-to-reel method for the plate processing and etching. In addition, the metal substrate apparatus for an IC card module according to the present invention is well-suited for the mass-production of IC card modules and the reel-to-reel manufacturing method can be used for each processing step.

For smoothly loading the IC chip, a die pad is larger than the IC chip. The IC chip loading region of said die pad is also made thinner than the thickness of the metal substrate by half-etching. Through this manufacturing method, the IC module can meet the demand for thinner modules.

Further, as the strip of thin processing material is made of metal, Cu or 42 alloy (42% Ni—Fe alloy) is normally used from the viewpoint of conductivity, processability, and versatility, but the metal material is not limited to these.

In regard to the thickness of the thin processing material comprised of metal, a thickness meeting the demand for a thin IC module is desired, but preferably, the thickness is around 0.1 mm.

In regard to the outside of the die pad region, a concave part or though-hole is arranged to improve adhesion with a sealing resin, and a sealing resin support part is disposed integrally with the antenna terminals to provide highly reliable sealing.

Manufacturing an IC card module apparatus according to the method of the present invention enables a manufacturing process well-suited for mass-production of IC modules for non-contact IC cards.

In other words, the present invention can be achieved through the use of the reel-to-reel manufacturing method.

As the strip of thin processing material is made of metal, Cu or 42 alloy (42% Ni—Fe alloy) is normally used from the viewpoint of conductivity, processability, and versatility, but the metal material is not limited to these.

As explained above, the present invention provides for a metal substrate used in an IC module for non-contact IC cards which is better suited for mass-production than conventional substrates. At the same time, the manufacturing of an IC module incorporating the metal substrates is made easier.

DETAILED DESCRIPTION OF THE INVENTION

The embodiments of the metal substrate apparatus for an IC card module will be explained with reference to the drawings.

Figure 2:
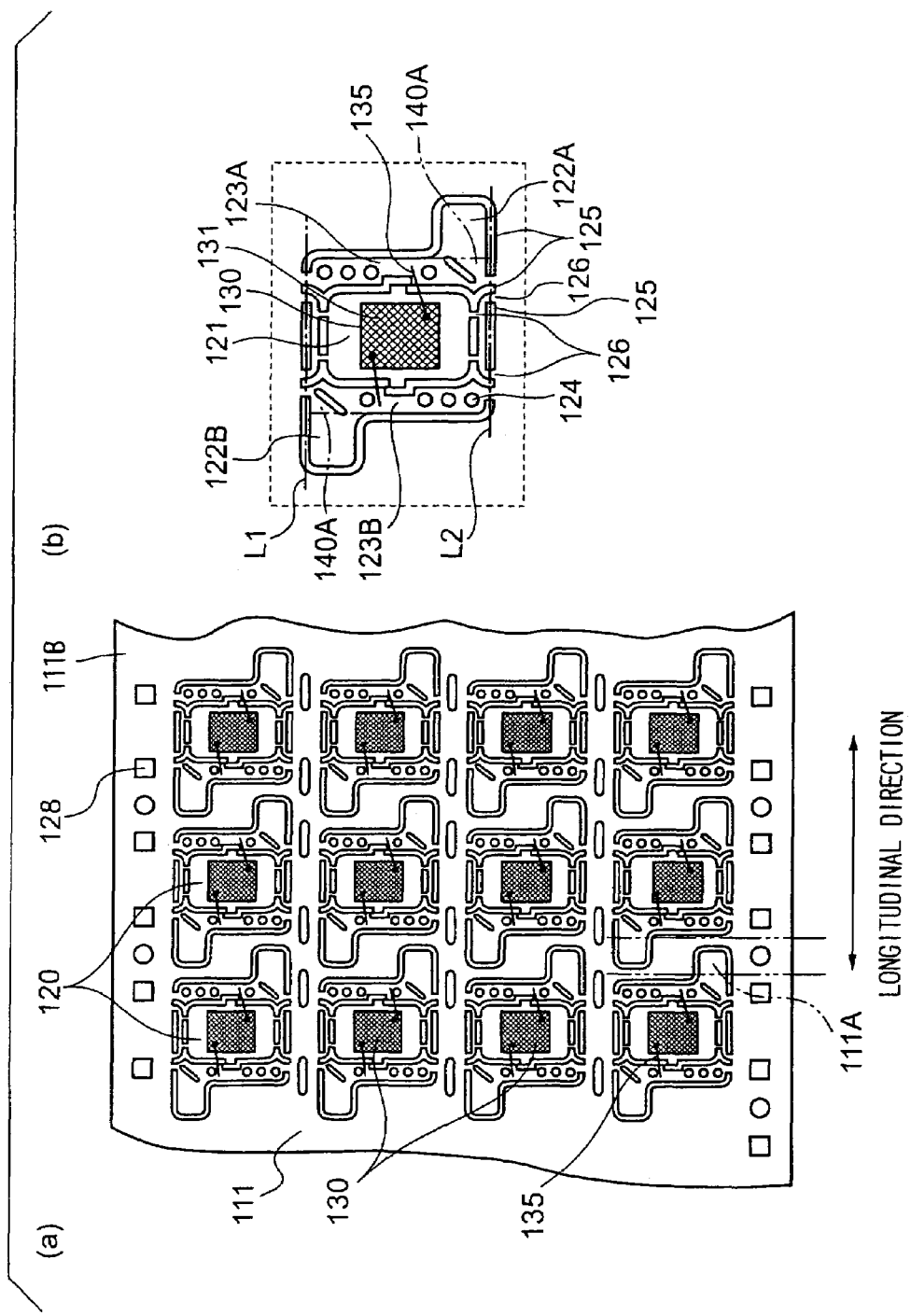
FIG. 2(a) shows the metal substrate apparatus for an IC card module apparatus of FIG. 1(a) in which IC chips are loaded onto each of the metal substrates and connected to the substrates by wire bonding.
FIG. 2(b) shows an individual metal substrate in the same condition.
Figure 3:
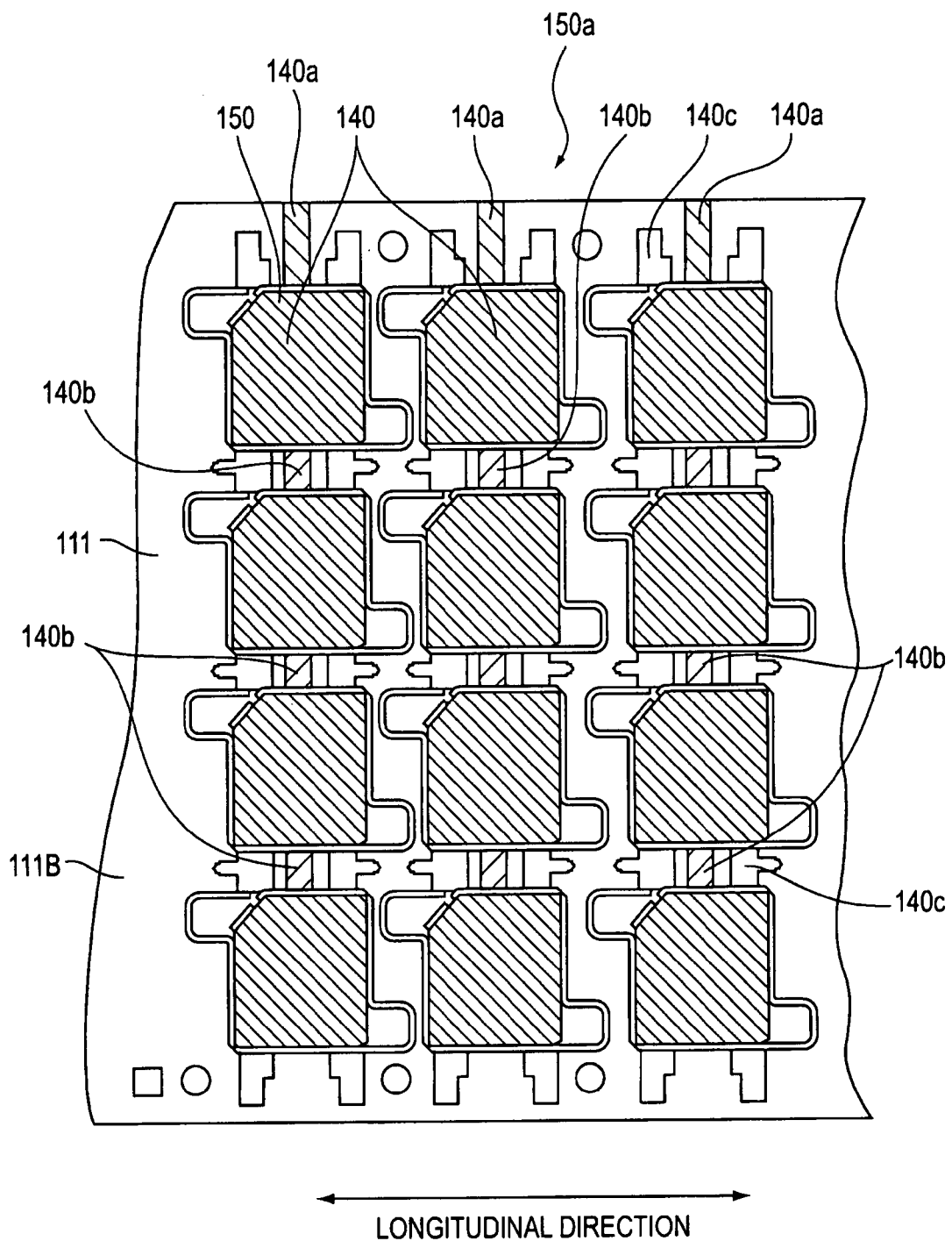
FIG. 3 shows the metal substrate apparatus of FIG. 2(a) in which a transfer mold processing is made.
Figure 4:
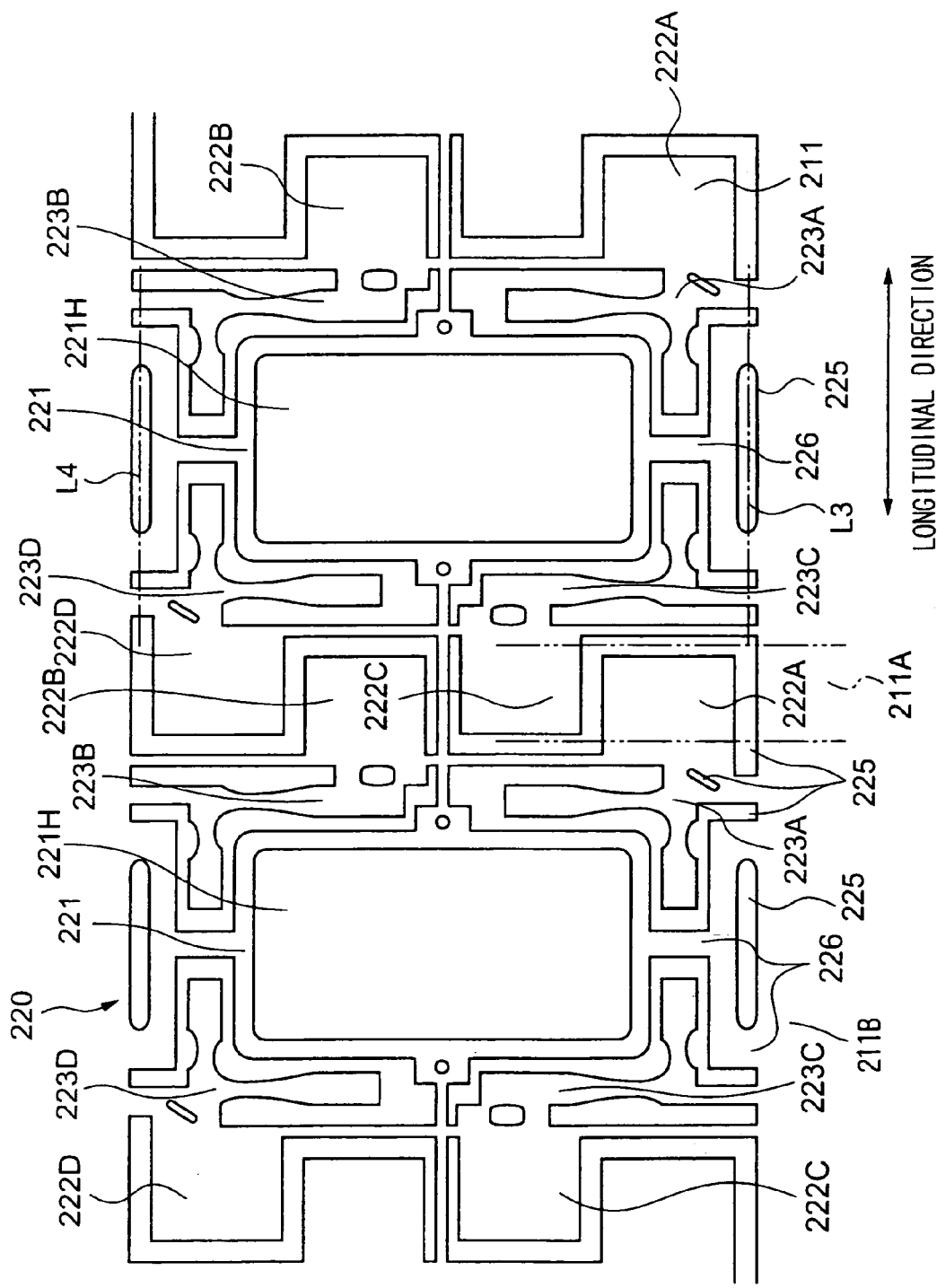
FIG. 4 is a schematic view of a part of the metal substrate apparatus for an IC card module according to a second embodiment.
Figure 5:
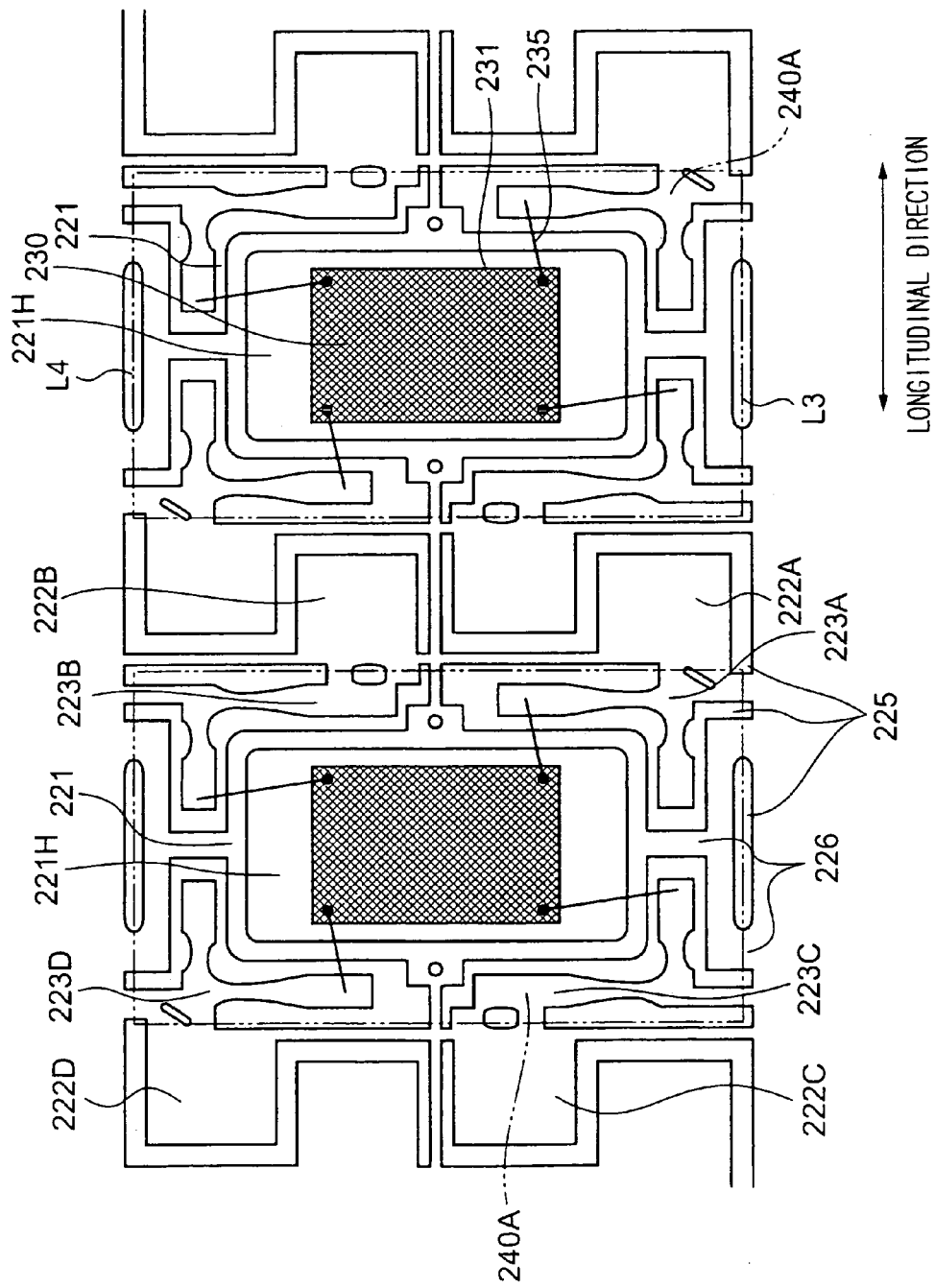
FIG. 5 shows the metal substrate apparatus for an IC card module apparatus of FIG. 4 in which IC chips are loaded into each of the metal substrates and connected to the substrates by wire bonding.
Figure 6:
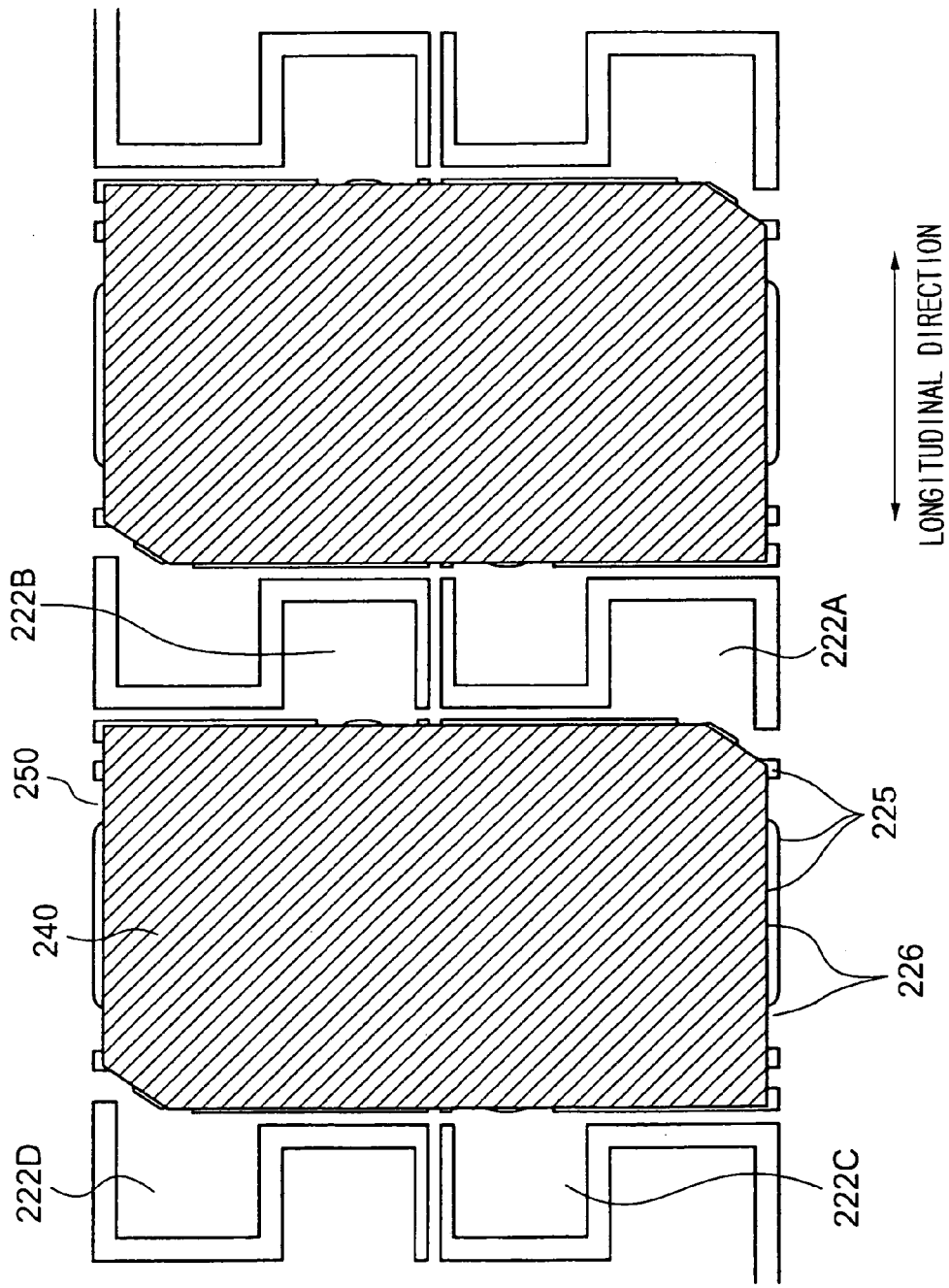
FIG. 6 shows the metal substrate apparatus of FIG. 5 in which a transfer mold processing is made.
Figure 7:
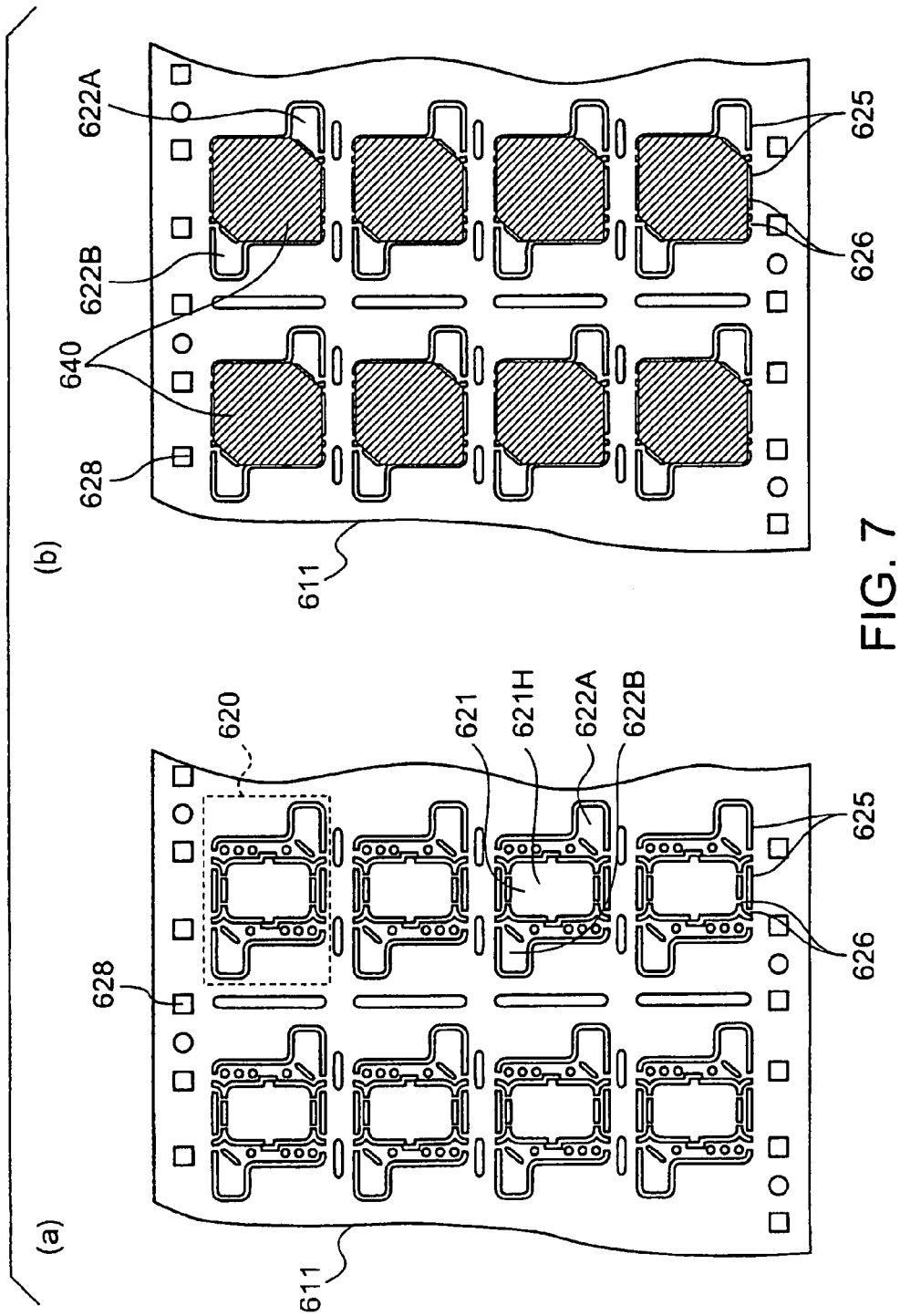
FIGS. 7(a) and 7(b) show manufacturing steps of a metal substrate apparatus and an IC module according to a conventional method.
Figure 8:
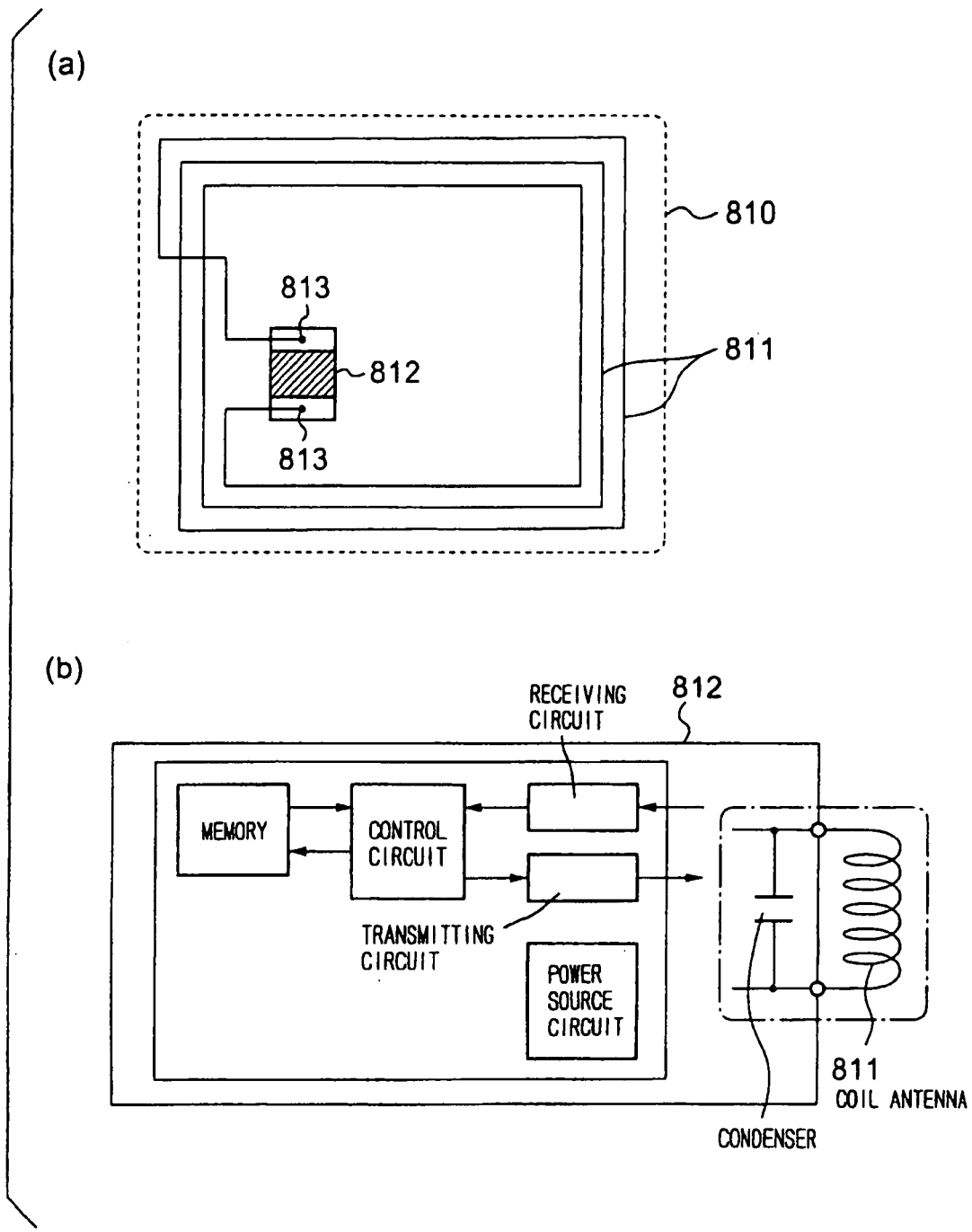
FIGS. 8(a) and 8(b) show an IC module for a non-contact IC card and its circuit structure.
Figure 9:
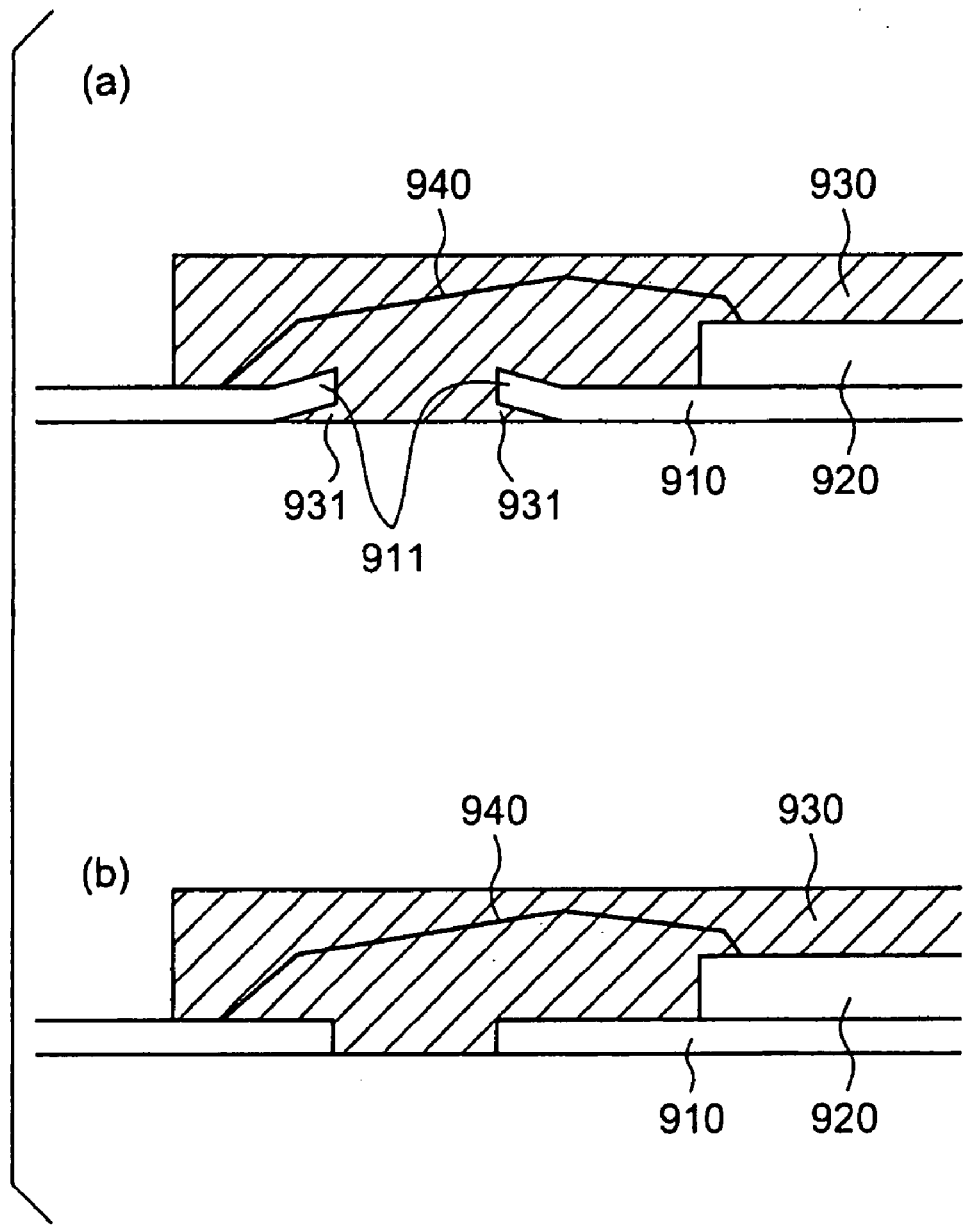
FIGS. 9(a) and 9(b) show the relationship between a manufacturing method for a metal substrate and resin leakage.

FIG. 1(a) shows a part of a metal substrate apparatus for an IC card module according to a first embodiment of the present invention, and FIG. 1(b) shows an individual metal substrate. FIG. 2(a) shows the metal substrate apparatus for an IC card module apparatus of FIG. 1(a) in which IC chips are loaded into each of the metal substrates and connected to the substrates by wire bonding, and FIG. 2(b) shows an individual metal substrate in the same condition. FIG. 3 shows the metal substrate apparatus of FIG. 2(a) in which a transfer mold processing is made. FIG. 4 is a schematic view of a part of the metal substrate apparatus for an IC card module according to a second embodiment. FIG. 5 shows the metal substrate apparatus for an IC card module apparatus of FIG. 4 in which IC chips are loaded onto each of the metal substrates and connected to the substrates by wire bonding. FIG. 6 shows the metal substrate apparatus of FIG. 5 in which a transfer mold processing is made.

In FIGS. 1-6, there are shown a processing material 111, metal substrate 120, die pad 121, half-etching part 121H, antenna terminals 122A, 122B (connecting to the antennas), internal terminals 123A, 123B, through-hole 124, through-hole part 125, connecting part 126, sprocket 128, IC chip 130, terminal 131, bonding wire 135, sealing resin 140, die pad 221, half-etching part 221H, antenna terminals 222A, 222B, 222C, 222D (connecting to the antennas), internal terminals 223A, 223B, 223C, and 223D, through-hole 225, connecting part 226, sprocket 228, IC chip 230, terminal 231, bonding wire 235, and sealing resin 240.

The first embodiment of the metal substrate apparatus for an IC card module will be explained with reference to FIGS. 1(a), 1(b), 2(a), and 2(b).

The metal substrate apparatus for an IC card module of the first embodiment forms an IC card module for a transfer mold-type non-contact IC card with a plurality of individual metal substrates 120 and one antenna loop (see FIG. 1(b)). The metal substrate 120 is formed by etching a thin strip of the processing material 111 made of a conductive metal. The parts of the metal substrates are connected to each other by the connecting parts 126.

In other words, the metal substrate apparatus comprises a plurality of individual metal substrates 120 formed by etching a long strip processing material 111 extending in the longitudinal direction between a pair of reels 100A and 100B.

The metal substrates 120 are formed in four rows in the width direction and are connected longitudinally on the processing material 111.

Each metal substrate 120 has a die pad 121 for loading an IC chip, a resin-sealed region 140A which encompasses the die pad 121, and a pair of antenna terminals 122A, 122B which protrude longitudinally in opposite directions from the die pad and the resin-sealed region. The pair of antenna terminals 122A, 122B are arranged opposite the resin-sealed region 140A. The corners of the sealing resin 140 on the antenna terminal 122B side are chamfered and are used as an index of a polar region of the side of the antenna terminal 122B.

The antenna terminal 122A of one metal substrate 120 and the antenna terminal 122B of the longitudinally adjacent metal substrate are located within the same shared region 111A of the processing material 111 in a width direction.

Each metal substrate 120 is connected to the part 111B (FIG. 1(b)) of the processing material 111 by the connecting part 126 positioned along longitudinal connecting lines L1, L2. After a resin sealing is made, the metal substrates 120 can be separated from the part 111B of the processing material 111 simply by adding longitudinal cuts at a prescribed width on the processing material 111, running along the connecting lines L1, L2.

In the present embodiment, internal terminals 123A, 123B are disposed between the die pad 121 of the metal substrate 120 and the antenna terminals 122A, 122B to be integrally connected with the antenna terminals 122A, 122B, respectively. The internal terminals 123A, 123B are located within the resin-sealed region 140A, and a through-hole 124 is disposed to improve the adhesion of the internal terminals 123A, 123B with the sealing resin. The through-hole 124 includes a concave part, but the concave part does not have to be a penetrable hole.

The processing material 111 is typically made of Cu or 42 alloy (42% Ni—Fe alloy) from the viewpoint of conductivity, processability, and versatility, but the material is not limited to these metals.

With regard to the thickness of the thin strip of metallic processing material, the thickness should be suitable to meet the demand for a thin IC module.

In a modified version of the first embodiment, the die pad 121 is larger than the IC chip 130 in order to smoothly load the IC chip with the terminal surface facing upward on the metal substrate 120. By half-etching the IC chip loading region 130A of the said die pad 121, the processing material 111 can be formed even thinner.

In this modified version, it is possible to form an even thinner IC module.

The second embodiment of the metal substrate apparatus for an IC module will be explained with reference to FIGS. 4-6.

The metal substrate apparatus for an IC card module of the second embodiment used for an IC card module for a transfer mold-type non-contact IC card, comprises a plurality of individual metal substrates 220 and two antenna loops. The metal substrate 220 is formed by etching a thin strip of a processing material 211 made of a conductive metal. The parts of the metal substrates are connected to each other by connecting parts 226.

In the second embodiment, a die pad 221 is larger than an IC chip 230 in order to smoothly load the IC chip with the terminal surface facing upward on the metal substrate 220. By half-etching, the half-etching part 221H of the said die pad 221 can be formed even thinner.

This second embodiment makes it possible to form an even thinner IC module than the IC module in the first embodiment.

FIG. 4 is an enlarged view of two adjacent metal substrates positioned longitudinally on the processing material 211.

In FIG. 4, the metal substrate 220 is comprised of the die pad 221, antenna terminals 222A, 222B, 222C, 222D, internal terminals 223A, 223B, 223C, 223D, and connecting parts 226 to connect the foregoing parts to the part 221B of the processing material 211. The metal substrates 220 are positioned longitudinally on the surface of the processing material 211 so that the antenna terminals 222A, 222B, 222C, 222D of the metal substrate 220 overlap the same shared region 211A with the antenna terminals of longitudinally adjacent metal substrates 220 in the width direction.

In the second embodiment, since there are two antenna loops, antenna terminals 222A, 222B, 222C, and 222D protrude longitudinally from the die pad 221 and resin-sealed region 240, the former pair extended in an opposite direction from the latter pair.

The second embodiment does not include through-holes in the internal terminals as shown in the first embodiment (through-hole 124 in FIGS. 1(a) and 1(b)), but they may be disposed as necessary. As shown in FIG. 4, each metal substrate 220 is connected to the part 221B of the processing material 211 by connecting parts 226 arranged on the longitudinally positioned connecting lines L3, L4. By adding cuts in the processing material 211 at a prescribed width longitudinally along the connecting lines L3, L4 after a resin sealing is made, the metal substrate 220 can be separated from the part 211B of the processing material 211 to form a desired shape.

Figure 1:
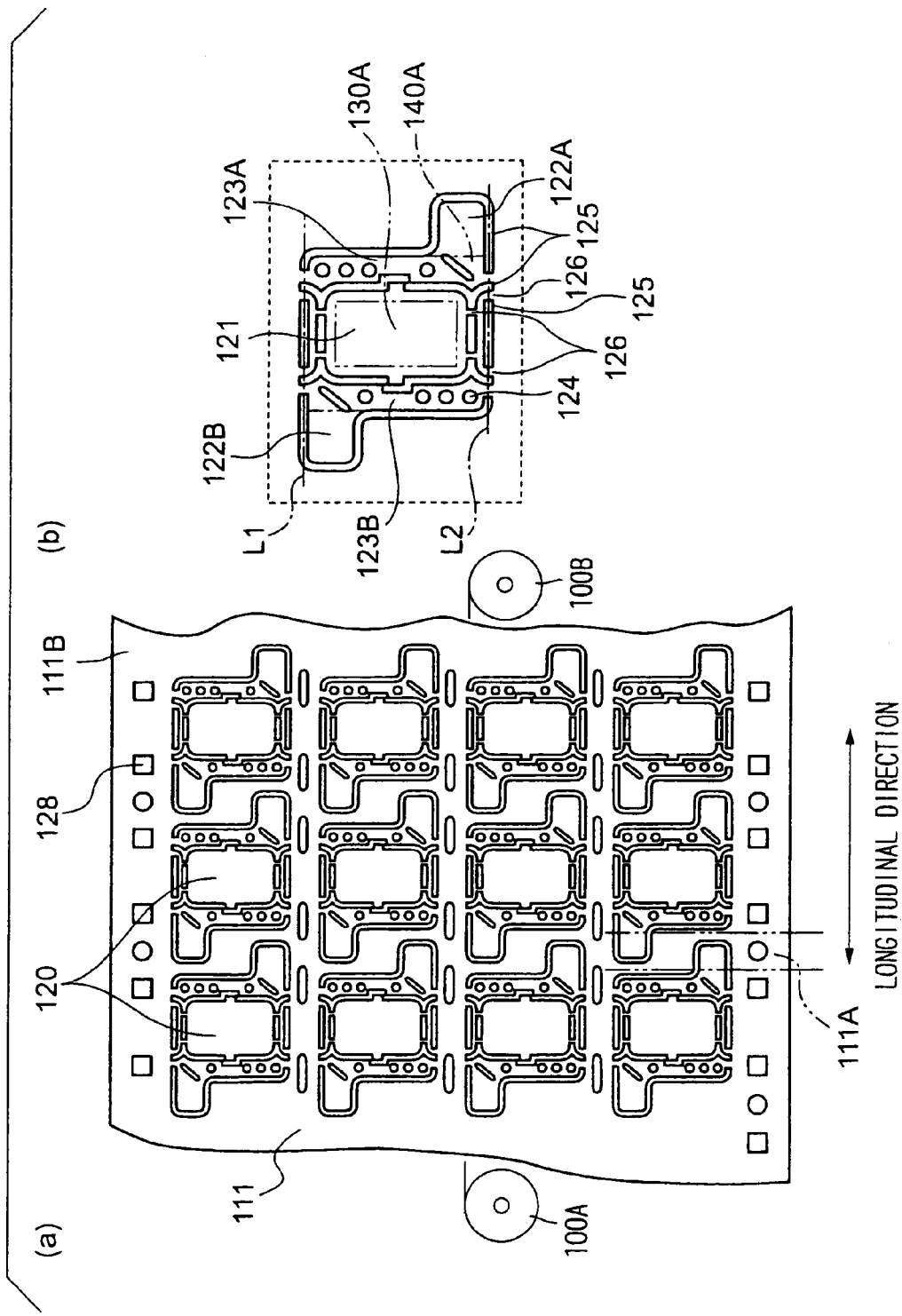
FIG. 1(a) shows a part of a metal substrate apparatus for an IC card module according to a first embodiment of the present invention.
FIG. 1(b) shows an individual metal substrate.

The first embodiment of a manufacturing method of an IC card module apparatus will now be described with reference to FIGS. 1-3.

The IC card module apparatus according to the first embodiment is manufactured using the first embodiment of the metal substrate apparatus shown in FIGS. 1(a) and 1(b).

In this embodiment, in the manufacturing method for a transfer mold-type IC card module used in manufacturing non-contact IC cards, the reel-to-reel method is employed for plate-making and etching of a thin metallic processing material 111 to form the metal substrate apparatus of the first embodiment shown in FIGS. 1(a) and 1(b).

The processing material 111 is typically a 0.1 mm thick strip of CU or 42 alloy (42% Ni—Fe alloy). An etching-resistant resist pattern is formed on both sides of the strip through a plate-making process, after which a prescribed etching solution is used to etch both sides of the metal substrate apparatus.

Since half etching is more precise, the etching process can be divided into two stages, in which the first etching is conducted on the etching surface, etched holes are filled with a prescribed filling material, and the second etching process is begun from the opposite side of the strip.

In the next step, a prescribed region of each metal substrate 120 of the etched metal substrate apparatus (FIG. 1(a)) undergoes silver plating through the reel-to-reel process, and an IC chip 130 is loaded onto an IC loading region 130A on a die pad 121 of each metal substrate 120 of the metal substrate apparatus. Instead of silver-plating a prescribed region of the metal substrate 120, the entire surface of the metal substrate 120 may be plated with palladium.

As shown in FIG. 2(a), the terminals (not shown) of the IC chip 130 are connected to the internal terminals 123A, 123B by wire bonding using a bonding wire 135.

Then, the resin sealing region 140A including the IC chip 130 and the bonding wire 135 are sealed by the transfer method using a sealing resin 140 (FIG. 3).

This process produces an IC card module apparatus 150a comprising a metal substrate apparatus, the IC chip 130 loaded on the die pad 121 of each metal substrate 120, bonding wire 135 connecting the IC chip 130 and the internal terminals 123A, 123B, and the sealing resin 140 covering the IC chip 130 and the bonding wire 135 (FIG. 3). In this embodiment, there are four rows of metal substrates 120 in the width direction, and the sealing resins 140 covering the IC chips 130 are accordingly disposed to cover four rows of metal substrates 120.

On the processing material 111, mold through gates 140b extending in the width direction are disposed to connect the sealing resins 140, and mold gates 140a are also disposed between the sealing resin 140 and the side edge of the processing material 111. The mold gates 140a and mold through gates 140b are formed of minimal thickness on the processing material 111. The sealing resins 140 are formed of resin flowing from the side edge of the processing material 111 through the mold gate 140a and mold through gate 140b.

As shown in FIG. 3, an opening 140c is arranged near the pair of antenna terminals 122A, 122B of each metal substrate to insulate the pair of antenna terminals 122A, 122B from the other parts of the processing material 111.

Since the opening 140c insulates the antenna terminals 122A, 122B from other parts of the processing material 111, a measurement process can be carried out on an entire IC card module apparatus 150a with a plurality of IC chips 130, in which the electrical properties of the IC chips 130 are measured simultaneously by a pair of measurement terminals (not shown) using the antenna terminals 122A, 122B. This measurement process is much faster and easier than a process in which the processing material 111 is cut at each IC chip 130 in order to obtain each IC module 150, and then the electrical property of each IC chip 130 of each IC module 150 is measured separately.

In the next manufacturing step, using a prescribed cutter, the connecting parts 126 are cut along the connecting lines L1, L2 shown in FIG. 1(b), and the processing material 111 is divided into individual units to obtain each IC module 150.

Through the method explained above, in the case of using the metal substrate apparatus shown in the second embodiment in FIG. 4, the reel-to-reel method is employed to plate prescribed regions of individual metal substrates 220 of the etched metal substrate apparatus of FIG. 4 with silver or palladium plating. Then, each metal substrate 220 of the metal substrate apparatus is loaded with an IC chip 230 on the die pad 221, and the IC chips 230 are connected to the metal substrates 220 by wire bonding using the bonding wire 235 (FIG. 5). Using the transfer method, the IC chip 230 and resin sealed region 240A including the bonding wire 235 are then sealed by sealing resin 240 (FIG. 6).

Using a prescribed cutter, the connecting parts 226 are cut along the connecting lines L1, L2 shown in FIG. 4, and the processing material 211 is divided into individual units to obtain each IC module 250.

The invention claimed is:

1. A metal substrate apparatus for a non-contact IC card module, comprising:
   a plurality of metal substrates;
   the plurality of metal substrates arranged longitudinally in a row and formed by etching a strip of a processing material extending in a longitudinal direction, wherein each metal substrate has a die pad for loading an IC chip, a resin-sealed region including the die pad, at least one pair of antenna terminals protruding longitudinally in opposite directions from the die pad and the resin-sealed region, and
   one of the antenna terminals of one metal substrate and one of the antenna terminals of the longitudinally adjacent metal substrate overlapping and located within the same region of the processing material in a width direction.

2. The metal substrate apparatus according to claim 1, wherein
   each metal substrate is connected to the processing material by connecting parts positioned on connecting lines running in a longitudinal direction,
   the metal substrates can be separated from the processing material by cutting along the connecting lines.

3. The metal substrate apparatus according to claim 1, wherein
   each metal substrate has two pairs of antenna terminals, each antenna terminal protruding longitudinally in opposite directions from the die pad and the resin-sealed area.

4. The metal substrate apparatus according to claim 1, wherein
   the die pad of each metal substrate is formed larger than the IC chip, and an IC chip loading region of the die pad is formed thinner than the processing material by half-etching.

5. The metal substrate apparatus according to claim 1, wherein
   each metal substrate includes a concave part or through-hole which is arranged in the resin-sealed region to improve the adhesion with a sealing resin to be provided on the resin-sealed region.

6. The metal substrate apparatus according to claim 1, wherein
   each metal substrate includes an internal terminal disposed between the die pad and the antenna terminal.

7. The metal substrate apparatus according to claim 1, wherein
   the processing material is made of either Cu or 42 alloy.

8. A method for manufacturing an IC card module, comprising the steps of: preparing a metal substrate apparatus for a non-contact IC card module comprising a plurality of metal substrates, the plurality of metal substrates arranged longitudinally in a row and formed by etching a strip of a processing material extending in a longitudinal direction, each metal substrate having a die pad for loading an IC chip, a resin-sealed region including the die pad, at least one pair of antenna terminals protruding longitudinally in opposite directions from the die pad and the resin-sealed region, one of the antenna terminals of one metal substrate and one of the antenna terminals of the longitudinally adjacent metal substrate overlapping and located within the same region of the processing material in a width direction,
   loading an IC chip on the die pad of each metal substrate;
   connecting the IC chip to a prescribed portion of the metal substrate with a wire through wire bonding;
   sealing the resin-sealed region of the metal substrate by covering the IC chip and wire with a sealing resin; and
   cutting the processing material for each IC chip.

9. The method for manufacturing an IC card module according to claim 8, wherein
   the processing material is made of Cu or 42 alloy.

10. An IC card module apparatus comprising:
    a metal substrate apparatus including a plurality of metal substrates arranged longitudinally in a row and formed by etching a strip of a processing material extending in a longitudinal direction, each metal substrate having a die pad for loading an IC chip, a resin-sealed region including the die pad, at least one pair of antenna terminals protruding longitudinally in opposite directions from the die pad and the resin-sealed region, one of the antenna terminals of one metal substrate and one of the antenna terminals of the longitudinally adjacent metal substrate overlapping and located within the same region of the processing material in a width direction;
    an IC chip loaded in the die pad of each metal substrate;
    a wire connecting the IC chip to a predetermined position of each of the metal substrates by wire bonding;
    a sealing resin provided in the resin-sealed region of each of the metal substrates to cover and seal the IC chip and wire;
    a mold gate disposed on the processing material, connected to the sealing resin and extending in a width direction.

11. The IC card module apparatus according to claim 10, wherein
    the metal substrates are arranged in multiple rows in a width direction on the processing material, and a mold through gate connecting the sealing resins of the metal substrates extends in the width direction.

12. The IC card module according to claim 10, wherein
    openings are disposed near the pair of antenna terminals of each metal substrate of the processing material to insulate the antenna terminals from other parts of the processing material.

* * * * *